United States Patent

Asatsuma et al.

[11] Patent Number: 6,104,039
[45] Date of Patent: Aug. 15, 2000

[54] P-TYPE NITROGEN COMPOUND SEMICONDUCTOR AND METHOD OF MANUFACTURING SAME

[75] Inventors: Tsunenori Asatsuma; Katsunori Yanashima; Takao Miyajima, all of Kanagawa, Japan

[73] Assignee: Sony Corporation, Tokyo, Japan

[21] Appl. No.: 09/084,187

[22] Filed: May 26, 1998

[30] Foreign Application Priority Data

May 26, 1997 [JP] Japan ..................................... 9-135406

[51] Int. Cl.$^7$ ..................................... H01L 33/00
[52] U.S. Cl. .......................... 257/22; 257/102; 257/103; 438/46; 438/47
[58] Field of Search .................. 257/22, 96, 102, 257/103; 438/46, 47

[56] References Cited

U.S. PATENT DOCUMENTS

| | | | |
|---|---|---|---|
| 4,862,471 | 8/1989 | Pankove | 372/45 |
| 5,005,057 | 4/1991 | Izumiya et al. | 257/13 |
| 5,146,465 | 9/1992 | Khan et al. | 372/45 |
| 5,831,277 | 11/1998 | Razeghi | 257/15 |

FOREIGN PATENT DOCUMENTS

| | | |
|---|---|---|
| 196 03 782 A1 | 8/1996 | Germany . |
| WO 98/42024 | 9/1998 | WIPO . |

*Primary Examiner*—Mark V. Prenty
*Attorney, Agent, or Firm*—Hill & Simpson

[57] ABSTRACT

A plurality of first layers made of AlGaN mixed crystal each having a thickness of the order of 1 to 100 nm and a plurality of second layers of p-type GaN with Mg each having a thickness of the order of 1 to 100 nm are alternately stacked. Since each of the first and second layers is thin, the stacked layers as a whole have properties of p-type AlGaN mixed crystal although the first layers do not include Mg and the second layers do not include Al. An Al source and a Mg source are temporally separated to be introduced in a stacking process. A reaction between the Al source and Mg source which may interfere desirable crystal growth is thereby prevented. Crystals of good quality are thus grown and electrical conductivity is thereby improved.

9 Claims, 2 Drawing Sheets

P-TYPE NITROGEN COMPOUND SEMICONDUCTOR AND METHOD OF MANUFACTURING SAME

BACKGROUND OF THE INVENTION

1. Field of the Invention

The present invention relates to a p-type nitrogen compound semiconductor including at least one group III element selected from the group consisting of gallium (Ga), aluminum (Al), boron (B) and indium (In), nitrogen (N) and at least one p-type impurity selected from the group consisting of magnesium (Mg), zinc (Zn) and carbon (C) and a method of manufacturing the same.

2. Description of the Related Art

In the fields of short wavelength light emitting devices, environmentresistant devices, high frequency electronic devices and so on, nitrogen compound semiconductors including GaN, an AlGaN mixed crystal, an InGaN mixed crystal and a BAlGaInN mixed crystal are potential materials for making up such devices. In particular light emitting diodes (LED) using such nitrogen compound semiconductors have been practically utilized and received attention. An achievement of laser diode (LD) has been reported as well, raising the expectation for applications to optical disks and so on.

For practical applications of such devices, it is important to efficiently manufacture high-quality nitrogen compound semiconductors to a sufficient degree to be used for such devices. Producing high-quality p-type and n-type nitrogen compound semiconductors is particularly important for optical devices so as to effectively recombine electrons with holes and to efficiently pass a current.

For manufacturing nitrogen compound semiconductors, methods such as metal organic chemical vapor deposition (MOCVD) and molecular beam epitaxy (MBE) may be used. In the MOCVD method, for example, a source gas of group III element such as gallium, aluminum or indium (an organic metal gas) is introduced together with a source gas of nitrogen such as an ammonia ($NH_3$) gas over a heated substrate to be reacted. A nitrogen compound semiconductor is thus epitaxially grown on the substrate. In the MBE method, corpuscular beams of group III element and nitrogen are irradiated on a substrate for epitaxially growing a group III-nitrogen compound semiconductor.

For producing an n-type semiconductor, a source gas or a corpuscular beam of n-type impurity such as silicon (Si) is introduced together with a source gas or corpuscular beams of group III element and nitrogen. An n-type nitrogen compound semiconductor with high crystallinity and electrical conductivity is thus easily produced. For producing a p-type semiconductor, a source gas or corpuscular beam of p-type impurity such as magnesium, zinc or carbon is introduced together with a source gas or corpuscular beams of group III element and nitrogen for growing a crystal. Carriers are then activated through electron beam irradiation or thermal annealing, for example, if necessary.

Although an n-type group III nitrogen compound semiconductor is easily manufactured, it is difficult to produce a p-type group III-nitrogen compound semiconductor. Another problem is that crystallinity and conductivity thereof are low. Furthermore, the proportion of the composition and p-type impurity concentration are nonuniform in a grown surface of crystal (a surface parallel to a substrate surface). This is because a source gas or corpuscular beam of group III element and a source gas or corpuscular beam of p-type impurity react to each other before reaching the substrate.

It is particularly difficult to produce a p-type AlGaN mixed crystal to which magnesium is added as p-type impurity. The aluminum proportion of such an AlGaN mixed crystal as a mother crystal is significantly low compared to one without magnesium. The electrical property as a p-type semiconductor is significantly reduced as well compared to GaN with magnesium of similar amount. That is, aluminum of group III elements is particularly easy to react to magnesium of p-type impurity.

SUMMARY OF THE INVENTION

It is an object of the invention to provide a p-type nitrogen compound semiconductor with high crystallinity and electrical conductivity and having a uniform composition and p-type impurity concentration in a crystal grown surface and a method of manufacturing the same.

A p-type nitrogen compound semiconductor of the invention includes at least one group III element selected from the group consisting of gallium, aluminum, boron and indium, nitrogen and a p-type impurity. The compound semiconductor comprises a plurality of first layers and a plurality of second layers alternately stacked. The formula of the first layers or a group III element included in the first layers is different from that of the second layers and p-type impurity concentration therein is different from that of the second layers.

A method of manufacturing a p-type nitrogen compound semiconductor of the invention is provided for forming such a compound semiconductor including at least one group III element selected from the group consisting of gallium, aluminum, boron and indium, nitrogen and a p-type impurity. The method comprises the step of stacking a plurality of first layers and a plurality of second layers alternately. At least one group III element is included only in the first layers of the first and second layers and at least one p-type impurity is included only in the second layers of the first and second layers.

The p-type nitrogen compound semiconductor of the invention comprises the plurality of first and second layers alternately stacked. The formula of the first layers or the group III element included in the first layers is different from that of the second layers and p-type impurity concentration therein is different from that of the second layers. The compound semiconductor has properties of one p-type group III-nitrogen compound semiconductor as a whole.

The method of manufacturing a p-type nitrogen compound semiconductor of the invention includes the process of stacking the plurality of first and second layers alternately. At least one group III element is included only in the first layers of the first and second layers and at least one p-type impurity is included only in the second layers of the first and second layers. As a result, the group III element and p-type impurity, which may interfere desirable crystal growth if included together, are separated into the first layers and second layers, respectively.

Other and further objects, features and advantages of the invention will appear more fully from the following description.

DETAILED DESCRIPTION OF THE PREFERRED EMBODIMENT

A preferred embodiment of the invention will now be described in detail with reference to the accompanying drawings.

Figure 1:
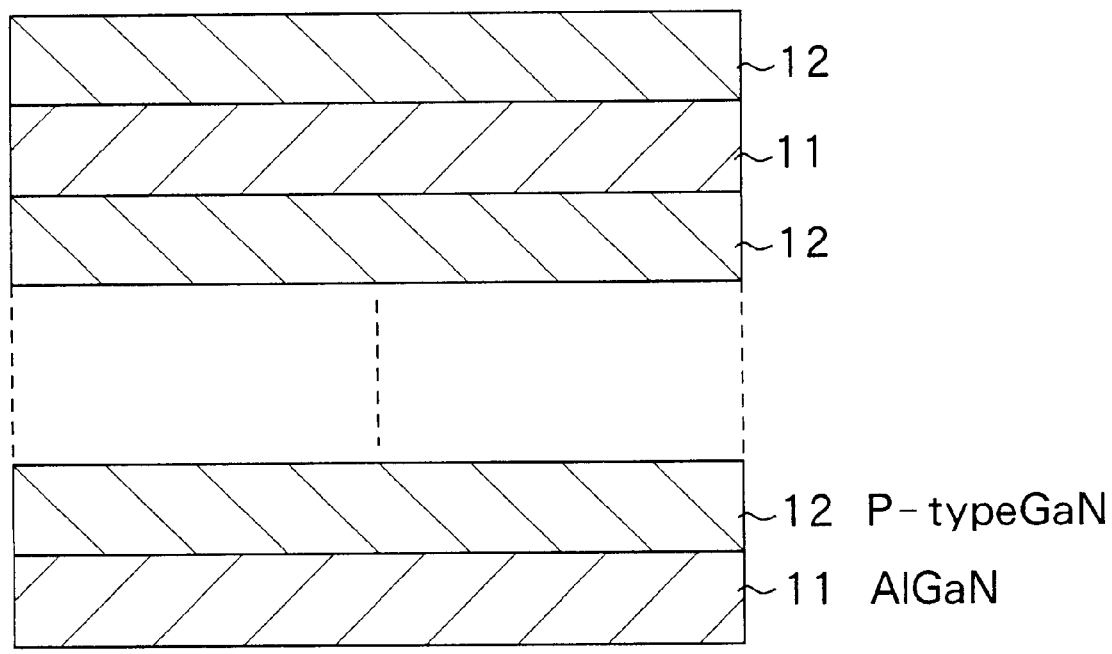
FIG. 1 illustrates a structure of a p-type nitrogen compound semiconductor of an embodiment of the invention.

FIG. 1 illustrates a structure of a p-type nitrogen compound semiconductor of the embodiment of the invention. The p-type nitrogen compound semiconductor is made up of a mother crystal consisting of aluminum and gallium of group III elements and nitrogen to which magnesium as p-type impurity is added. However, the composition, the element of group III included therein and p-type impurity concentration are not uniform throughout the p-type nitrogen compound semiconductor. The compound semiconductor comprises a plurality of first layers 11 and second layers 12 alternately stacked. Each of the first layers 11 has a formula or an element of group III different from that of each of the second layers 12 and p-type impurity concentration different from that of each of the second layers 12.

For example, as shown in parentheses in FIG. 1, the first layers 11 are each made up of AlGaN mixed crystal. The second layers 12 are each made up of p-type GaN including magnesium as p-type impurity. That is, of aluminum of group III and magnesium as p-type impurity each making up the p-type nitrogen compound semiconductor, the first layers 11 each include aluminum but do not include magnesium while the second layers 12 each include magnesium but do not include aluminum. The compound semiconductor comprises the first layers 11 and the second layers 12 alternately stacked.

Although not shown in FIG. 1, the first layers 11 may be each made up of p-type AlGaN mixed crystal including magnesium whose p-type impurity concentration is lower and proportion of aluminum of group III is higher than those of each of the second layers 12. The second layers 12 may be each made up of p-type AlGaN mixed crystal including magnesium whose p-type impurity concentration is higher and proportion of aluminum is lower than those of each of the first layers 11. That is, the p-type nitrogen compound semiconductor comprises the first layers 11 each including more aluminum than the second layers 12 and the second layers 12 each including more magnesium than the first layers 11 alternately stacked.

The first layers 11 and the second layers 12 each have a thickness of the order of 1 to 100 nm, for example. Therefore the p-type nitrogen compound semiconductor of the embodiment comprises the first layers 11 and the second layers 12 each of which is thin. Consequently, the first layers 11 not including magnesium and the second layers 12 not including aluminum alternately stacked have properties of p-type AlGaN mixed crystal as a whole. The first layers 11 and the second layers 12 stacked each having magnesium concentration and proportion of aluminum different from each other have properties of p-type AlGaN mixed crystal as a whole. The thickness of each of the first layers 11 may be either equal to or different from that of each of the second layers 12.

The p-type nitrogen compound semiconductor with such a structure may be produced through the following method.

An appropriate substrate such as a sapphire substrate is utilized. Through MOCVD or MBE in an appropriate chamber, AlGaN mixed crystal layers without magnesium as the first layers 11 and p-type GaN layers with magnesium as the second layers 12 are alternately stacked (a stacking process).

Through MOCVD, for example, an appropriate source gas is selectively introduced together with a carrier gas into the chamber while the substrate is heated to an appropriate temperature (800 to 1000° C., for example) for growing the crystal layers on the substrate. For example, a source gas used for aluminum may be a trimethylaluminum gas (($CH_3$)$_3$Al). A source gas for gallium may be a trimethylgallium gas (($CH_3$)$_3$Ga). A source gas for nitrogen may be an ammonia gas. A source gas for magnesium may be a bis-methylcyclopentadienylmagnesium gas (($CH_3C_5H_4$)$_2$Mg) or a bis-cyclopentadienylmagnesium gas (($C_5H_5$)$_2$Mg). A carrier gas may be any of a hydrogen gas ($H_2$), a nitrogen gas ($N_2$) and so on. For growing the AlGaN mixed crystal layers, source gases of aluminum, gallium and nitrogen are selectively introduced. For growing the p-type GaN layers, source gases of magnesium, gallium and nitrogen are selectively introduced.

Through MBE, corpuscular beams of aluminum, gallium, nitrogen and magnesium are selectively irradiated onto the substrate for growing the crystal layers.

Heat treatment is performed if necessary, having grown the first layers 11 and the second layers 12 as described so far. Aluminum in the first layers 11 (the AlGaN mixed crystal layers) and magnesium in the second layers 12 (the p-type GaN layers) are thereby partly diffused into each other. Through the heat treatment the first layers 11 become p-type AlGaN layers whose magnesium concentration is low and proportion of aluminum is high. The second layers 12 become p-type AlGaN layers whose magnesium concentration is high and proportion of aluminum is low. The p-type nitrogen compound semiconductor of the embodiment is thus formed.

As described so far, the p-type nitrogen compound semiconductor of the embodiment comprises the plurality of first layers 11 each of AlGaN mixed crystal and the plurality of second layers 12 each of p-type GaN including magnesium as p-type impurity alternately stacked. Alternatively, the compound semiconductor of the embodiment comprises the plurality of first layers 11 each of p-type AlGaN mixed crystal including minute quantities of magnesium and the plurality of second layers 12 each of p-type AlGaN mixed crystal including minute quantities of aluminum alternately stacked. As a result, crystallinity and so on of each of the first layers 11 and the second layers 12 are easily improved. The compound semiconductor as a whole therefore has properties of p-type AlGaN mixed crystal while crystallinity and electrical conductivity thereof are improved. Uniformity of composition and p-type impurity concentration in the grown surface are improved as well.

The method of manufacturing a p-type nitrogen compound semiconductor of the embodiment provides the AlGaN mixed crystal layers as the first layers 11 and the p-type GaN layers as the second layers 12 alternately stacked. As a result, an aluminum source and a magnesium source to be introduced, which may interfere desirable crystal growth if introduced together, are temporally separated. The first layers 11 and the second layers 12 are thus each formed with high crystallinity and electrical conductivity and uniform composition and p-type impurity concentration in the grown surface. Consequently, the p-type nitrogen compound semiconductor of high quality with properties of p-type AlGaN mixed crystal as a whole is easily manufactured.

A practical implementation of the invention will now be described.

Figure 2:
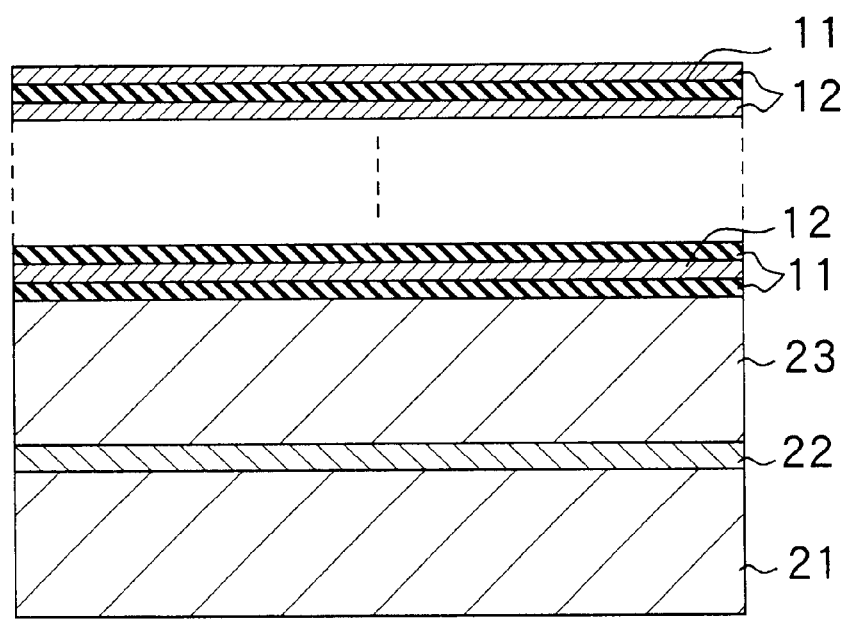
FIG. 2 illustrates a structure of a sample grown through MOCVD in the implementation of the invention.

In this implementation, as shown in FIG. 2, a buffer layer 22 of GaN with a thickness of approximately 20 nm and a GaN layer 23 with a thickness of approximately 1 μm were formed on a substrate 21 made of sapphire. On the GaN layer 23 twenty of first layers 11 each made of AlGaN mixed crystal with a thickness of 10 nm and twenty of second layers 12 each made of p-type GaN with magnesium with a thickness of 10 nm were alternately stacked.

Figure 3:
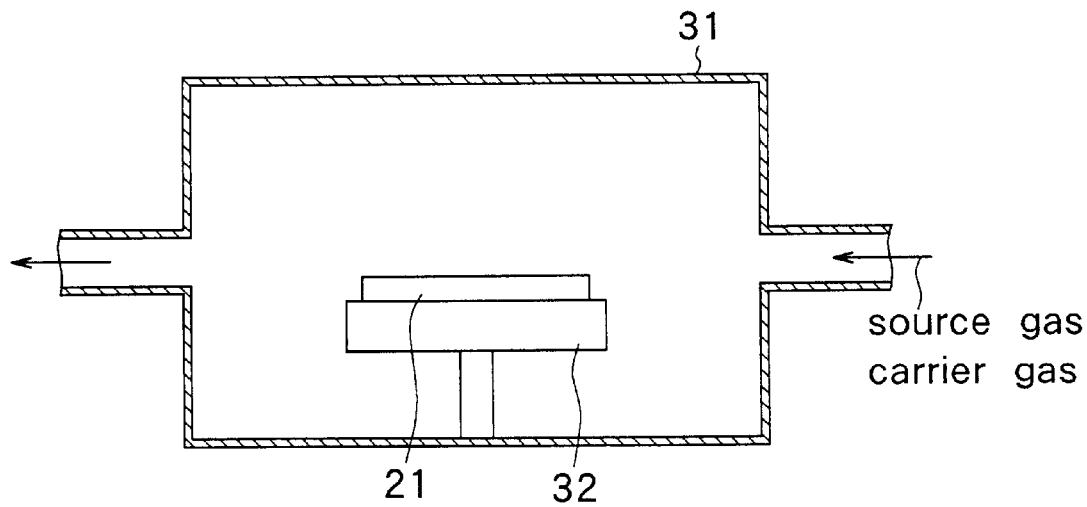
FIG. 3 is a schematic view for illustrating MOCVD for growing the sample shown in FIG. 2.

Those layers were formed through MOCVD as shown in FIG. 3. That is, the substrate 21 was placed on a worktable 32 provided inside an appropriate reaction chamber 31. A source gas together with a carrier gas was introduced parallel to the surface of the substrate 21 (that is, the grown surface). The substrate 21 was heated to 1000° C. by a heater not shown installed in the worktable 32.

A source gas used for aluminum was a trimethylaluminum gas. A source gas for gallium was a trimethylgallium gas. A source gas for nitrogen was an ammonia gas. A source gas for magnesium was a bis-methylcyclopentadienylmagnesium gas. These gases were selectively introduced to the chamber in accordance with the layers to be grown. That is, a trimethylaluminum gas, a trimethylgallium gas and an ammonia gas were introduced for growing the first layers 11. A bis-methylcyclopentadienylmagnesium gas, a trimethylgallium gas and an ammonia gas were introduced for growing the second layers 12. A hydrogen gas and a nitrogen gas were used for a carrier gas.

Heat treatment was then performed for activating carriers. The sample of the implementation was thus produced.

Figure 4:
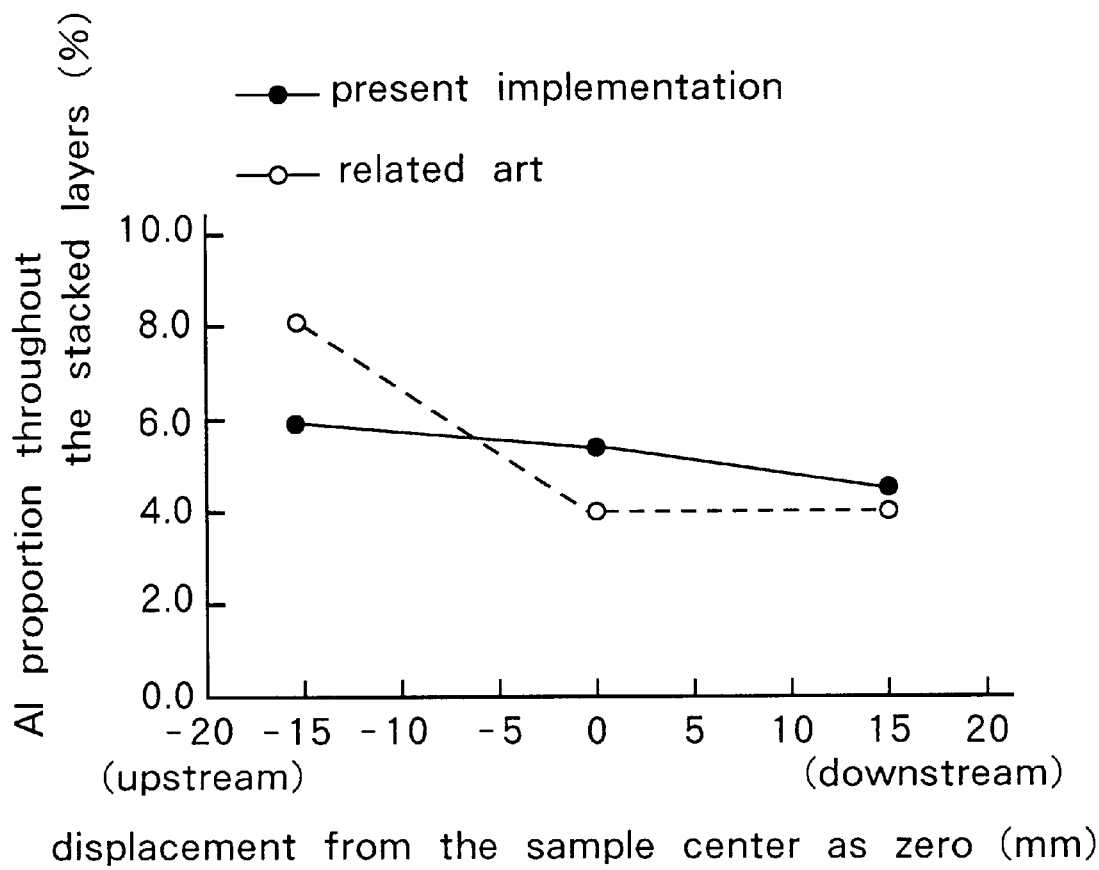
FIG. 4 is a plot showing the relationship between the aluminum proportion and the position in the grown surface of the sample produced in an implementation of the invention.

An X-ray analysis was performed on the sample for analyzing the proportion of aluminum in the whole layers of first layers 11 and second layers 12 averaged. The analysis was performed on a plurality of points in the grown surface of the sample, that is, three points each in the center in the direction of source gas flow, upstream and downstream, respectively. FIG. 4 shows the result of analysis compared to a sample of related art. The related art sample was made similarly to the sample of the implementation of the invention except that p-type AlGaN mixed crystal layers were formed through simultaneously introducing source gases of aluminum, gallium, nitrogen and magnesium, instead of the first layers 11 and the second layers 12 of the present implementation.

As shown in FIG. 4, the proportion of aluminum in the related art sample was high at the upstream point and significantly reduced at the central point and the downstream point. This was because the source gases of aluminum and magnesium were reacted to each other upstream and the aluminum proportion in the grown surface thereby became nonuniform. In contrast the difference in aluminum proportion was small between the points in the sample of the implementation of the invention. The proportion of aluminum was high in the sample on the average. That is, crystallinity and uniformity of the proportion of composition in the grown surface were improved in the implementation of the invention compared to the related art.

The carrier concentration measured on the sample was 1 to $3 \times 10^{17}$ cm$^{-3}$. It was impossible to measure the carrier concentration of the related art sample since the resistance was too high to obtain an ohmic contact with placing electrodes. Therefore electrical conductivity was improved as well in the implementation of the invention compared to the related art.

The present invention is not limited to the embodiment and implementation described so far but may be practiced in still other ways. For example, the foregoing embodiment and implementation provide the p-type nitrogen compound semiconductor made up of the mother crystal consisting of aluminum and gallium of group III elements and nitrogen to which magnesium as p-type impurity is added. The invention is applicable to any other p-type nitrogen compound semiconductor including at least one group III element selected from the group consisting of gallium, aluminum, boron and indium, nitrogen and at least one p-type impurity selected from the group consisting of magnesium, zinc and carbon.

For manufacturing such a compound semiconductor, a plurality of first and second layers are alternately stacked in a stacking process. The first layers each include at least one of the group III elements. The second layers each include at least one of the p-type impurities.

Although the p-type nitrogen compound semiconductor is made up of the first layers 11 and the second layers 12 in the foregoing embodiment, the compound semiconductor of the invention may further comprise other layers in addition to the first layers 11 and the second layers 12. For example, third layers of p-type AlGaN mixed crystal may be each placed between the first layer 11 of AlGaN mixed crystal and the second layer 12 of p-type GaN in the case where aluminum in the first layers 11 (AlGaN mixed crystal layers) and magnesium in the second layers 12 (p-type GaN layers) are diffused in a very narrow range through heat treatment in the foregoing embodiment.

Furthermore, although the foregoing embodiment and implementation provide the method of manufacturing the p-type nitrogen compound semiconductor of the invention through MOCVD or MBE, the invention is applicable to a manufacturing scheme using any other method.

As described so far, the p-type nitrogen compound semiconductor of the invention comprises the plurality of first and second layers alternately stacked. The formula of the first layers or the group III element included in the first layers is different from that of the second layers and p-type impurity concentration therein is different from that of the second layers. It is therefore easy to improve crystallinity and so on of each of the first and second layers. Crystallinity and electrical conductivity of the whole compound semiconductor are thus improved. Uniformity of composition and p-type impurity concentration in the grown surface are improved as well. An improvement in quality is thus achieved for a short wavelength light source device, an environment-resistant device, a high frequency electronic device and so on using the p-type nitrogen compound semiconductor of the invention.

The method of manufacturing a p-type nitrogen compound semiconductor of the invention includes the process for stacking the plurality of first and second layers alternately. At least one group III element is included only in the first layers of the first and second layers and at least one p-type impurity is included only in the second layers of the first and second layers. As a result, the group III element and p-type impurity, which may interfere desirable crystal growth if introduced together, are temporally separated. The first and second layers are thus formed, each having high crystallinity and conductivity and uniform composition and p-type impurity concentration in the grown surface. The p-type nitrogen compound semiconductor of excellent quality having properties of p-type AlGaN mixed crystal as a whole is thus easily manufactured.

Obviously many modifications and variations of the present invention are possible in the light of the above teachings. It is therefore to be understood that within the scope of the appended claims the invention may be practiced otherwise than as specifically described.

What is claimed is:

1. A p-type nitrogen compound semiconductor comprising:

a plurality of first layers each comprising nitrogen, a p-type impurity and at least one group III element selected from the group consisting of gallium, aluminum and indium, and a plurality of second layers each comprising nitrogen, a p-type impurity and at least one group III element selected from the group consisting of gallium, aluminum and indium, the first and second layers being alternately stacked and wherein a formula of said first layers or the group III element included in said first layers is different from that of said second layers and the p-type impurity concentration of the first layers is different from that of said second layers.

2. A p-type nitrogen compound semiconductor according to claim 1 wherein the p-type impurity comprises at least one element selected from magnesium, zinc and carbon.

3. A p-type nitrogen compound semiconductor according to claim 1 wherein at least one group III element is included in said first layers only among said first and second layers and at least one p-type impurity is included in said second layers only among said first and second layers.

4. A p-type nitrogen compound semiconductor according to claim 1 including at least aluminum of group III element and at least magnesium of p-type impurity wherein:

aluminum is included in said first layers only or more aluminum is included in said first layers than said second layers among said first and second layers and magnesium is included in said second layers only or more magnesium is included in said second layers than said first layers among said first and second layers.

5. A method of manufacturing a p-type nitrogen compound semiconductor comprising the step of:

alternately stacking a plurality of first layers each comprising nitrogen and at least one group III element selected from the group consisting of gallium, aluminum, boron and indium, and a plurality of second layers each consisting essentially of nitrogen, a p-type impurity and at least one group III element selected from the group consisting essentially of gallium, aluminum and indium, wherein at least one group III element is included only in said first layers and not in said second layers and at least one p-type impurity is included only in said second layers and not in said first layers.

6. A method of manufacturing a p-type nitrogen compound semiconductor according to claim 5 wherein the p-type impurity comprises at least one element selected from magnesium, zinc and carbon.

7. A method of manufacturing a p-type nitrogen compound semiconductor according to claim 5 wherein said compound semiconductor including at least aluminum of group III element and at least magnesium of p-type impurity wherein:

aluminum is included only in said first layers of said first and second layers and magnesium is included only in said second layers of said first and second layers in said stacking process.

8. A p-type nitrogen compound semiconductor according to claim 1 wherein the first and second layers do not include phosphorous.

9. A method of manufacturing a p-type nitrogen compound semiconductor according to claim 5 wherein the first and second layers do not include phosphorous.

* * * * *